(12) United States Patent
Lee et al.

(10) Patent No.: US 6,699,644 B1
(45) Date of Patent: Mar. 2, 2004

(54) PROCESS FOR FORMING A PHOTORESIST PATTERN COMPRISING ALKALINE TREATMENT

(75) Inventors: Geun Su Lee, Kyoungki-do (KR); Hyeong Soo Kim, Kyoungki-do (KR); Jin Soo Kim, Taejeon-shi (KR); Cha Won Koh, Seoul (KR); Sung Eun Hong, Kyoungki-do (KR); Jae Chang Jung, Kyoungki-do (KR); Min Ho Jung, Kyoungki-do (KR); Ki Ho Baik, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 227 days.

(21) Appl. No.: 09/651,443

(22) Filed: Aug. 30, 2000

(30) Foreign Application Priority Data

Aug. 31, 1999 (KR) ............................................. 99-36606

(51) Int. Cl.$^7$ ................................................. G03F 7/00
(52) U.S. Cl. ......................... 430/322; 430/327; 430/950
(58) Field of Search ................................. 430/311, 322, 430/327, 950

(56) References Cited

U.S. PATENT DOCUMENTS 5,792,596 A * 8/1998 Yasuzato ..................... 430/327
6,274,295 B1 * 8/2001 Dammel ..................... 430/322

FOREIGN PATENT DOCUMENTS

KR      1999-003164      1/1999
KR      11-190908      7/1999

* cited by examiner

*Primary Examiner*—Kathleen Duda
(74) *Attorney, Agent, or Firm*—Townsend and Townsend and Crew LLP

(57) ABSTRACT

The present invention provides a method for reducing or eliminating a poor pattern formation on a photoresist film by contacting the photoresist film with an alkaline solution prior to its exposure to light. Methods of the present invention significantly reduce or prevent T-topping and top-loss.

16 Claims, 4 Drawing Sheets

PROCESS FOR FORMING A PHOTORESIST PATTERN COMPRISING ALKALINE TREATMENT

BACKGROUND OF THE INVENTION

1. Field of the Invention

The present invention relates to a method for reducing a poor pattern formation on a photoresist film by contacting the photoresist film with an alkaline solution prior to its exposure to light.

2. Description of the Background Art

In a conventional photoresist pattern formation process, a photoresist film is produced by depositing hexamethyldisilazane (HMDS) on a substrate to enhance the adhesiveness between the substrate and the photoresist composition. The photoresist film is then exposed to light and developed in tetramethylamoniumhydroxide (TMAH) solution to obtain a pattern.

In general, when there is a delay between exposure of the photoresist film to light and development of the exposed photoresist, acids that are generated on the exposed area are neutralized by amine compounds that may be present in the production atmosphere. Since the pattern formation depends on acids that are generated by the exposure, neutralization of acids by atmospheric amine compounds reduce, prevent or alter a pattern formation, e.g., a T-topping phenomenon may occur where the top portion of the pattern forms a T-shape. As a result, a post-exposure delay may result in a poor pattern formation and a gap formation in CD (Critical Dimension).

To reduce or prevent the above described problems, a top anti-reflective coating (hereinafter abbreviated as "Top ARC") applied to the photoresist film has been used; however, in many cases the use of Top ARC results in a severe top loss in the upper portion of the photoresist film. In theory, an acidic Top ARC material will prevent a poor pattern formation by neutralizing the amine compounds, which may be present in the atmosphere, and thereby preventing the amine compounds from neutralizing the acids which are generated during the exposure. However, the use of an acidic Top ARC material results in even more severe top loss. Without being bound by any theory, it is believed that this is due to the fact that the acidic Top ARC materials contain carboxyl and hydroxyl groups which form hydrogen bonding with the acids that are generated during exposure. This hydrogen bonding effectively increases the concentration of the acid in the upper portions of the photoresist film. These acids then diffuse into the unexposed regions during post exposure bake (PEB) causing undesired top loss.

Therefore, there is a need for a method to reduce or prevent poor pattern formation and/or top loss of a photoresist film.

SUMMARY OF THE INVENTION

The present inventors have found that T-topping caused by post exposure delay and top loss caused by having Top ARC material coating on a photoresist film can be significantly reduced or eliminated by contacting the photoresist film with an alkaline solution prior to its exposure.

DETAILED DESCRIPTION OF THE INVENTION

As used herein, the term "alkaline treatment process" refers to a process of contacting a photoresist film with an alkaline solution.

The term "photoresist film" refers to a composition comprising a substrate, preferably a semiconductor substrate, coated with a photoresist composition.

The term "exposing" and "exposure" refers to a process of exposing a photoresist film to light using a light source.

Unless otherwise stated, the term "light" refers to light generated by a specific light source used to form a pattern on the photoresist film. The term does not include light from an ambient source.

The present invention provides a method for reducing or eliminating a poor pattern formation on a photoresist film in a photolithography process. The method generally involves contacting the photoresist film with an alkaline solution prior to its exposure to light. In this manner, a poor pattern formation on a photoresist film can be significantly reduces or eliminates compared to a method where the photoresist film is not treated with the alkaline solution prior to exposure to light.

In one aspect of the present invention provides a process for forming a photoresist pattern comprising the steps of:

(a) coating a chemically amplified photoresist composition on a semiconductor substrate to form a photoresist film;

(b) contacting said photoresist film with an alkaline solution;

(c) exposing said alkaline treated photoresist film to light using a light source; and (d) developing said exposed photoresist film.

In one embodiment of the present invention, the alkaline solution of the present invention has pH of at least about pH 7.

In another embodiment of the present invention, the alkaline solution includes an ammonium salt, alkaline metal salt, alkali earth metal salt, or mixtures thereof. Preferably, the alkaline solution includes an ammonium salt.

Preferably, the ammonium salt is a compound of the formula: $R_4N^+X^-$, where X is a halide or —OR', and each of R and R' is independently hydrogen, or a substituted or unsubstituted linear or branched ($C_1$–$C_{20}$) alkyl group. More preferably, the ammonium salt is selected from the group consisting of tetramethylammonium hydroxide, tetrabutylammonium hydroxide, and mixtures thereof.

Preferably, the alkaline metal salt and alkali earth metal salt is a compound of the formula: or $MX_n$, where M is an alkaline metal or an alkali earth metal, n is 1 or 2, X is a halide or —OR', and R' is hydrogen or a substituted or unsubstituted linear or branched ($C_1$–$C_{20}$) alkyl group. Exemplary alkaline metals include Li, Na, K, Rb, Cs, and Fr. Exemplary alkali earth metals include Be, Mg, Ca, Sr, Ba and Ra. It should be appreciated that in general when M is alkaline metal n is 1, and when M is an alkali earth metal n is 2. For compounds of the formula $MX_n$, X is preferably —OR', and R' is preferably hydrogen.

Preferably, the alkaline solution is an aqueous alkaline solution.

Figure 1A:
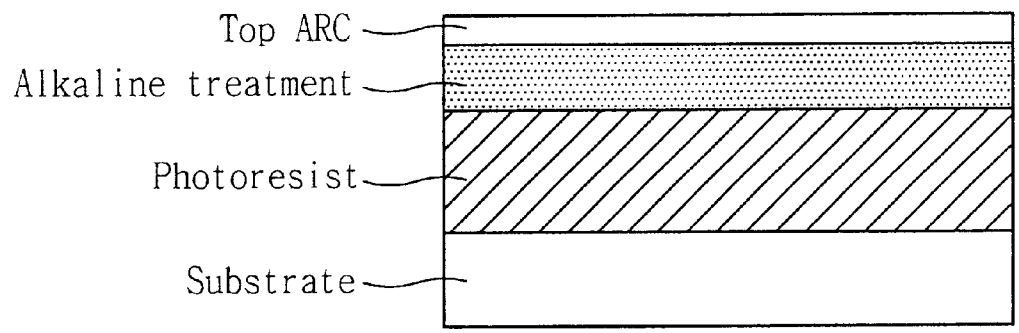
FIG. 1a is a schematic illustration of a cross sectional view of an alkaline treated photoresist film coated with an anti-reflective coating.
Figure 1B:
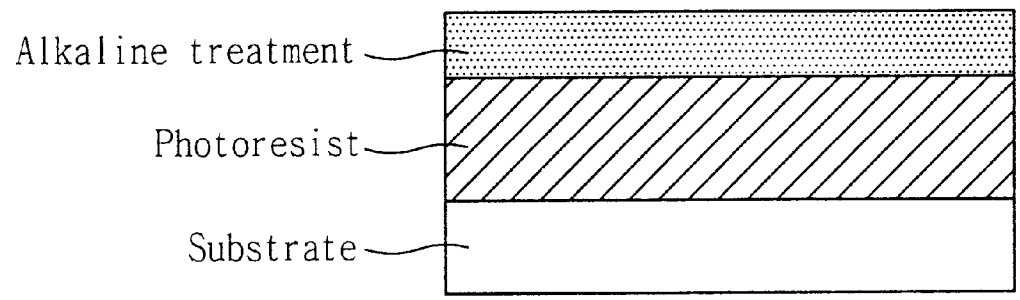
FIG. 1b is a schematic illustration of a cross sectional view of an alkaline treated photoresist film without an anti-reflective coating.

The process for forming the photoresist pattern can also include coating an anti-reflective material on the alkaline treated photoresist film prior to its exposure to light. See FIG. 1. However, coating the alkaline treated photoresist film with an anti-reflective material is not necessary as the process of the present invention produces a good pattern formation on the photoresist film with or without the presence of the anti-reflective material coating.

Without being bound by any theory, it is believed that the alkaline treatment before the exposure provides a barrier layer between the interface of the photoresist composition and the anti-reflective material coating. It is believed that this barrier prevents acids generated in the photoresist composition during the exposure from diffusing into the anti-reflective material coating layer, thereby preventing Top-loss. In addition, it is believed that a contact between the alkaline material and the acidic anti-reflective material results in formation of salts which reduces or prevents diffusion of environmental amine compound to the photoresist composition layer, thereby reducing or preventing T-Top formation. Furthermore, it has been found by the present inventors that an alkaline treatment also reduces or prevents Top-loss in photoresist films having no anti-reflective material coating.

When an anti-reflective material coating is present in the photoresist film, the thickness of the anti-reflective material coating is preferably from about 100 Å to about 3000 Å, and more preferably from about 100 Å to about 500 Å.

In the above process, soft bake can be done between the step (a) and the step (b), and/or post bake can be done between the step (c) and the step (d). Both baking processes being performed preferably at a temperature rage of from about 70 to about 120° C. for about 1 to about 2 minutes.

The exposure of a photoresist film to light is carried out using a light source such as ArF, KrF, VUV, EUV, E-beam, X-ray or ion-beam. Preferably, the irradiation energy is in the range of from about 1 to about 100 mJ/cm².

The developing step can be carried out using an alkali developing solution such as 0.01 to 5 wt % tetramethylammonium hydroxide (TMAH) solution.

Methods of the present invention are applicable to substantially all chemically amplified photoresists for ArF, KrF, VUV, EUV or E-beam. Moreover, methods of the present invention are applicable for obtaining either positive or negative photoresist patterns.

Another embodiment of the present invention provides a semiconductor element, which is produced by the above described methods.

The present invention will now be described in detail by referring to the Examples below, which are not intended to be limiting.

EXAMPLES

Invention Example 1

A chemically amplified photoresist composition comprising the polymer of Formula 1 was spin-coated on a silicon wafer to form a photoresist film. An aqueous solution of 2.38 wt % TMAH was spread on the photoresist film for 50 seconds and then the surface of the film is dried off. Next, the alkaline treated photoresist film was coated with an anti-reflective materials. The thickness of the anti-reflective material layer was from about 100 Å to about 2000 Å. The resulting photoresist film was exposed to light using an ArF light source, baked at 110° C. for 90 seconds, and developed in 2.38 wt % TMAH aqueous solution to obtain a 130 nm L/S pattern (see FIG. 2a).

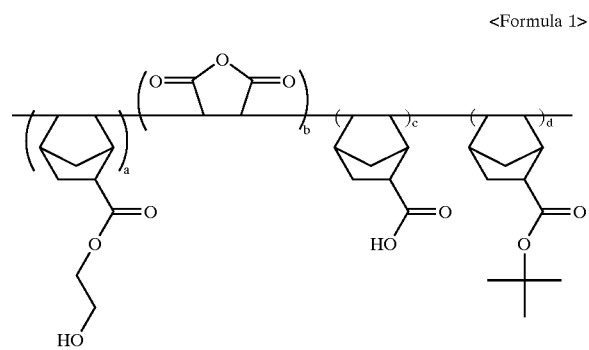

<Formula 1>

Comparison Example 1

Figure 2A:
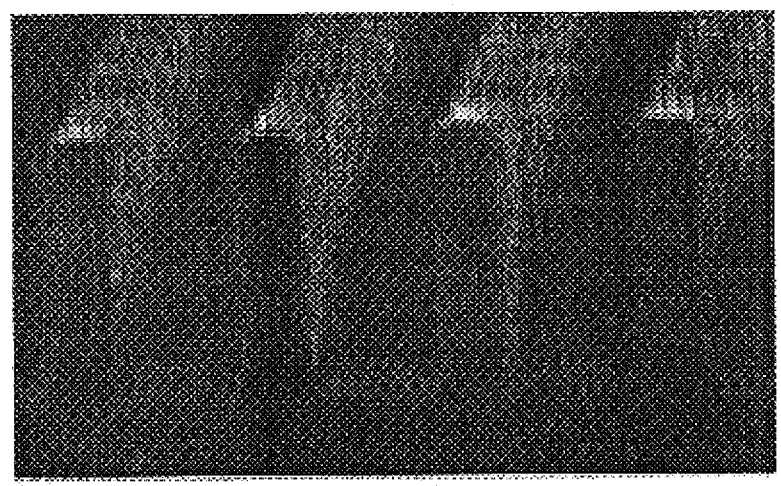
FIG. 2a shows a photoresist pattern which was produced using the procedure of Invention Example 1, in which a photoresist film was subjected to an alkaline treatment process and coated with an anti-reflective coating.
Figure 2B:
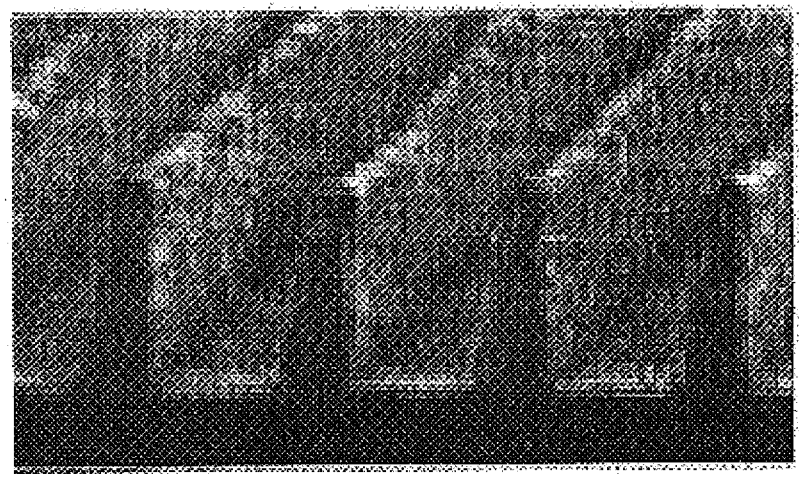
FIG. 2b shows a photoresist pattern which was produced using the procedure of Comparison Example 1, in which a photoresist film was coated with an anti-reflective coating without an alkaline treatment process.

The procedure of Invention Example 1 was repeated, except that the alkaline treatment (i.e., spreading 2.38 wt % aqueous TMAH solution for 50 seconds) was not carried out after coating the photoresist composition on the silicon wafer, to obtain a 130 nm LS pattern (see FIG. 2b).

Invention Example 2

Figure 3A:
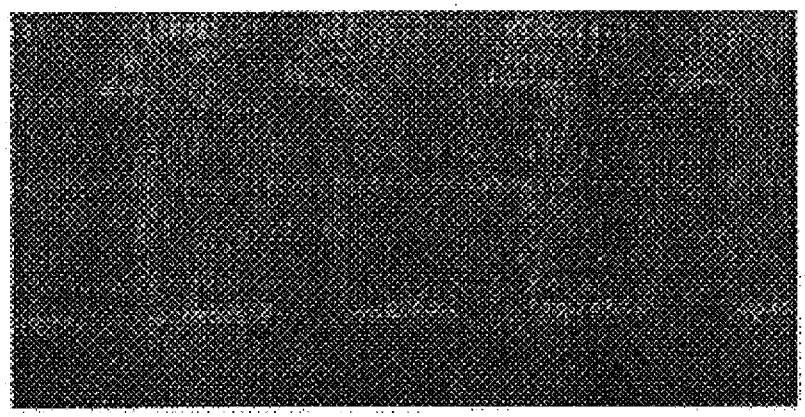
FIG. 3a shows a photoresist pattern which was produced using the procedure of Invention Example 2, in which a photoresist film was subjected to an alkaline treatment process and coated with an anti-reflective coating.
Figure 3B:
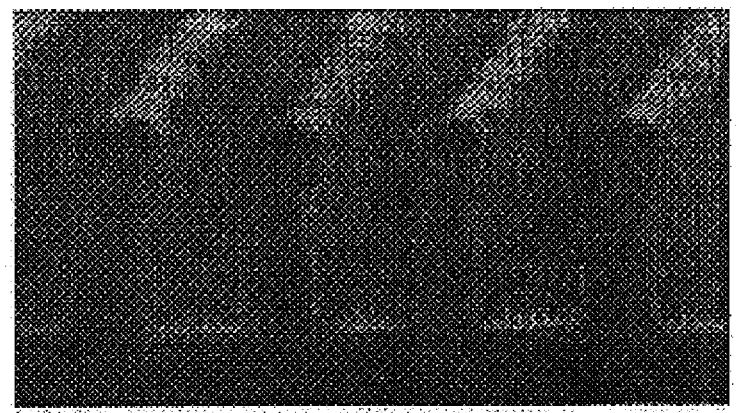
FIG. 3b shows a photoresist pattern which was produced using the procedure of Comparison Example 2, in which a photoresist film was coated with an anti-reflective coating without an alkaline treatment process.

The procedure of Invention Example 1 was repeated by using the photoresist composition comprising the polymer of Formula 2, instead of the photoresist composition comprising the polymer of Formula 1, to obtain a 130 nm LS positive pattern (see FIG. 3a).

<Formula 2>

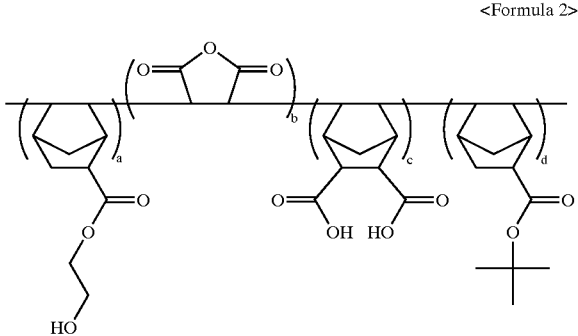

Comparison Example 2

The procedure of Invention Example 2 was repeated, except that the alkaline treatment (i.e., spreading 2.38 wt % aqueous TMAH solution for 50 seconds) was not carried out after coating the photoresist composition on the silicon wafer, to obtain a 130 nm LS pattern (see FIG. 2b).

Invention Example 3

A chemically amplified photoresist composition comprising the polymer of Formula 3 was spin-coated on a silicon wafer to form a photoresist film. An aqueous solution of 2.38 wt % TMAH was spread on the photoresist film for 50 seconds and then the surface of the film is dried off. The resulting photoresist film was exposed to light using an ArF light source, baked at 110° C. for 90 seconds, and developed in 2.38 wt % TMAH aqueous solution to obtain a 130 nm LS pattern (see FIG. 4a).

<Formula 3>

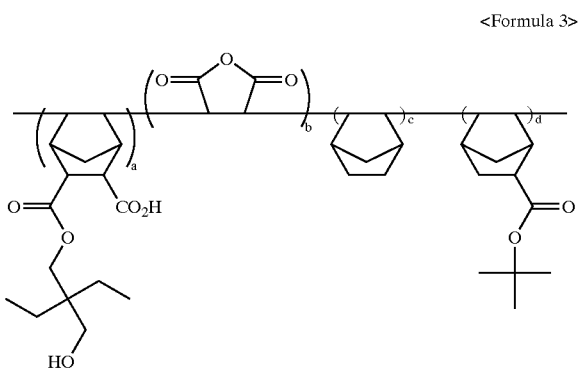

Comparison Example 3

Figure 4A:
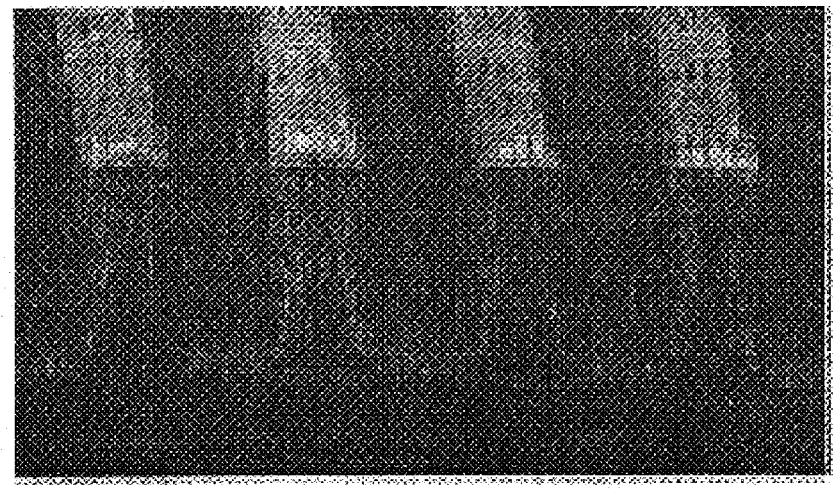
FIG. 4a shows a photoresist pattern which was produced using the procedure of Invention Example 3, in which a photoresist film was subjected to an alkaline treatment process and coated without an anti-reflective coating.
Figure 4B:
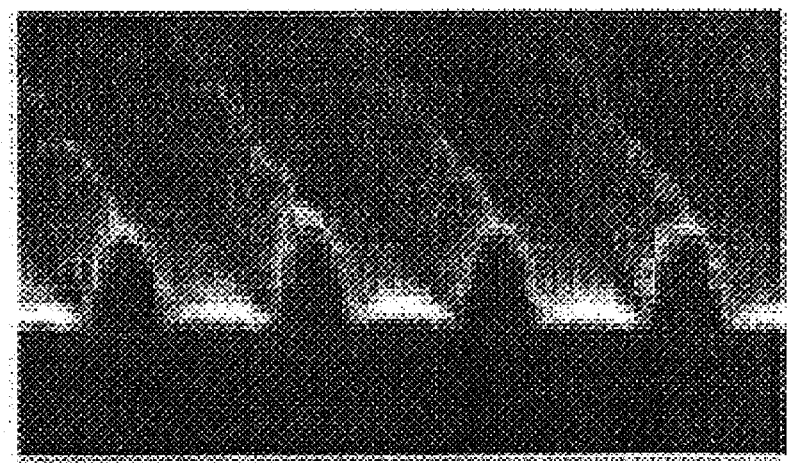
FIG. 4b shows a photoresist pattern which was produced using the procedure of Comparison Example 3, in which a photoresist film was neither contacted with an alkaline solution nor coated with an anti-reflective material.

The procedure of Invention Example 3 was repeated, except that the alkaline treatment (i.e. spreading 2.38 wt % aqueous TMAH solution for 50 seconds) was not carried out after coating the photoresist composition on the silicon wafer, to obtain a 130 nm L/S pattern (see FIG. 4b).

As shown in the present Invention Examples, good quality patterns were obtained without observing top-loss when the photoresist film treated with an alkaline solution prior to its exposure to light (FIG. 2a, FIG. 3a, and FIG. 4a). In contrast, a very severe top-loss was observed in all patterns obtained from the Comparison Examples, especially Comparison Example 3 (FIG. 4b), in which neither anti-reflective material coating was present nor alkaline treatment was performed.

Methods of the present invention significantly improve pattern shape and reproducibility. Therefore, unlike current methods for forming patterns on a variety of semiconductor elements, such as 64M DRAM, methods of the present invention can be used in pattern formation for a variety of semiconductor elements which requires minute patterns, such as 128M, 256M, 1G, 4G, 16G, 32G, and 64G DRAM.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method for reducing or eliminating a poor pattern formation on a photoresist film in a photolithography process comprising the steps of:

contacting a photoresist film with an alkaline solution; and coating the alkaline solution treated photoresist film with a water-soluble antireflective coating composition prior to exposure to light, wherein said method significantly reduces or eliminates a poor pattern formation on said photoresist film relative to a photoresist film that is not treated with said alkaline solution prior exposure to light.

2. The method of claim 1, wherein the pH of said alkaline solution is at least about pH 7.

3. The method of claim 1, wherein said alkaline solution comprises an ammonium salt, alkaline metal salt, alkali earth metal salt, or mixtures thereof.

4. The method of claim 3, wherein said ammonium salt is of the formula $R_4N^+X^-$, wherein X is a halide or —OR'; and each of R and R' is independently hydrogen, or substituted or unsubstituted linear or branched $C_1$–$C_{20}$ alkyl.

5. The method of claim 4, wherein said ammonium salt is selected from the group consisting of tetramethylammonium hydroxide, tetrabutylammonium hydroxide, and mixtures thereof.

6. The method of claim 3, wherein said alkaline metal salt and said alkali earth metal salt is of the formula: $MX_n$, wherein n is 1 or 2;

M is an alkaline metal or alkali earth metal;

X is a halide or —OR'; and

R' is hydrogen, or substituted or unsubstituted linear or branched $C_1$–$C_{20}$ alkyl.

7. The method of claim 1, wherein said alkaline solution is an aqueous alkaline solution.

8. A process for forming a photoresist pattern comprising the steps of:

(a) coating a chemically amplified photoresist composition on a semiconductor substrate to form a photoresist film;

(b) contacting said photoresist film with an alkaline solution;

(c) coating the alkaline solution treated photoresist film with a water-soluble antireflective coating composition;

(d) exposing the alkaline solution treated and antireflective composition coated photoresist film to light using a light source; and (e) developing said exposed photoresist film.

9. The process according to claim 8, wherein said the alkaline solution is an aqueous alkaline solution comprising an ammonium salt, alkaline metal salt, alkali earth metal salt, or mixtures thereof.

10. The process according to claim 9, wherein said ammonium salt is selected from the group consisting of tetramethylammonium hydroxide, tetrabutylammonium hydroxide, and mixtures thereof.

11. The process according to claim 8, wherein said anti-reflective coating has a thickness of from about 100 to about 3000 Å.

12. The process according to claim 11, wherein said anti-reflective coating has a thickness of from about 100 to about 500 Å.

13. The process according to claim 8, further comprising a soft baking step between said step (a) and said (b), or a post baking step between said step (c) and said step (d), or combinations thereof.

14. The process according to claim 13, wherein said baking step is performed at temperature in the range of from about 70 to about 200° C. for about 1 to about 2 minutes.

15. The process according to claim 8, wherein said light source is ArF, KrF, VUV, EUV, E-beam, X-ray or ion-beam.

16. The process according to claim 8, wherein said developing step comprises contacting said exposed photoresist film with an aqueous tetramethylammonium hydroxide solution.

* * * * *